(12) United States Patent
Yamamoto et al.

(10) Patent No.: US 9,209,015 B2
(45) Date of Patent: Dec. 8, 2015

(54) SUBSTRATE PROCESSING APPARATUS

(75) Inventors: Tetsuo Yamamoto, Toyama (JP); Naoki Matsumoto, Nanto (JP); Koichi Honda, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 158 days.

(21) Appl. No.: 12/783,312

(22) Filed: May 19, 2010

(65) Prior Publication Data

US 2010/0300357 A1    Dec. 2, 2010

(30) Foreign Application Priority Data

May 29, 2009  (JP) .................................. 2009-131056
Mar. 19, 2010 (JP) .................................. 2010-064651

(51) Int. Cl.
| | | |
|---|---|---|
| *C23C 16/00* | (2006.01) | |
| *H01L 21/306* | (2006.01) | |
| *C23F 1/00* | (2006.01) | |
| *H01L 21/02* | (2006.01) | |
| *C23C 16/34* | (2006.01) | |
| *C23C 16/455* | (2006.01) | |
| *C23C 16/50* | (2006.01) | |
| *H01J 37/32* | (2006.01) | |
| *C23C 16/52* | (2006.01) | |

(52) U.S. Cl.
CPC ........ *H01L 21/02274* (2013.01); *C23C 16/345* (2013.01); *C23C 16/45544* (2013.01); *C23C 16/45578* (2013.01); *C23C 16/50* (2013.01); *C23C 16/52* (2013.01); *H01J 37/32009* (2013.01); *H01J 37/3244* (2013.01); *H01J 37/32357* (2013.01); *H01L 21/0214* (2013.01); *H01L 21/0228* (2013.01); *H01J 2237/3321* (2013.01)

(58) Field of Classification Search
USPC .................... 118/723 E; 156/345.43–345.47; 315/111.21
See application file for complete search history.

(56) References Cited

U.S. PATENT DOCUMENTS

| | | | |
|---|---|---|---|
| 6,017,396 A * | 1/2000 | Okamoto ...................... 118/719 |
| 2003/0164143 A1* | 9/2003 | Toyoda et al. ............. 118/723 E |
| 2004/0025786 A1* | 2/2004 | Kontani et al. ................ 118/715 |
| 2007/0074814 A1* | 4/2007 | Hahn et al. ................ 156/345.31 |
| 2008/0035471 A1* | 2/2008 | Mikami et al. ........... 204/192.25 |
| 2008/0102222 A1* | 5/2008 | Fujinawa et al. ............. 427/569 |
| 2009/0102385 A1* | 4/2009 | Wi ........................... 315/111.21 |
| 2009/0151632 A1* | 6/2009 | Okuda et al. .................. 118/666 |

FOREIGN PATENT DOCUMENTS

| | | |
|---|---|---|
| JP | 2000054145 | 2/2000 |
| JP | 2002-280378 | 9/2002 |

(Continued)

*Primary Examiner* — Rakesh Dhingra
(74) *Attorney, Agent, or Firm* — Brundidge & Stanger, P.C.

(57) ABSTRACT

Provided is a substrate processing apparatus, which comprises a process chamber configured to process a substrate, a first plasma generation chamber in the process chamber, a first reactive gas supply unit configured to supply first reactive gas into the first plasma generation chamber, a pair of first discharge electrodes configured to generate plasma and to excite the first reactive gas, a first gas ejection port installed in a side wall of the first plasma generation chamber to eject an active species toward the substrate, a second plasma generation chamber in the process chamber, a second reactive gas supply unit configured to supply second reactive gas into the second plasma generation chamber, a pair of second discharge electrodes configured to generate plasma and to excite the second reactive gas, and a second gas ejection port installed in a side wall of the second plasma generation chamber to eject an active species.

17 Claims, 4 Drawing Sheets

(56) References Cited

FOREIGN PATENT DOCUMENTS

| JP | 2006190770 | 7/2006 | | |
| JP | 2006303431 | 11/2006 | | |
| JP | 2007266297 | 10/2007 | | |
| JP | WO2007/111348 | * 10/2007 | .............. | C23C 16/50 |
| KR | 1020020011323 | 2/2002 | | |
| KR | 1020080020963 | 3/2008 | | |

* cited by examiner

SUBSTRATE PROCESSING APPARATUS

CROSS-REFERENCE TO RELATED PATENT APPLICATION

This U.S. non-provisional patent application claims priority under 35 U.S.C. §119 of Japanese Patent Application Nos. 2009-131056, filed on May 29, 2009, and 2010-064651, filed on Mar. 19, 2010 in the Japanese Patent Office, the entire contents of which are hereby incorporated by reference.

BACKGROUND OF THE INVENTION

1. Field of the Invention

The present invention relates to a substrate processing apparatus, and in particular, to a substrate processing apparatus configured to use plasma for processing a substrate.

2. Description of the Prior Art

In the prior art, as one of manufacturing processes of a semiconductor device such as a dynamic random access memory (DRAM), a substrate processing process using plasma has been performed. Such a substrate processing process has been performed by using a substrate processing apparatus, which includes a process chamber configured to process a substrate, a plasma generation chamber installed in the process chamber, a gas supply unit configured to supply reactive gas into the plasma generation chamber, a discharge electrode configured to generate plasma in the plasma generation chamber and to excite the reactive gas for generating an active species, and a gas ejection port installed in a side wall of the plasma generation chamber to eject the active species of the reactive gas toward the substrate (for example, refer to Patent Document 1 below).

[Patent Document 1]
Japanese Unexamined Patent Application Publication No. 2002-280378

However, a conventional substrate processing apparatus just includes a single type plasma generation chamber and a single type discharge electrode in a process chamber. Thus, for example, to continuously perform a plurality of types of substrate processes, which are different in factors such as plasma generation condition or gas type, on an identical substrate, a plurality of substrate processing apparatuses are required according to types of substrate processes. Thus, costs for processing substrates may be increased. In addition, when two or more substrate processing apparatuses are used, a substrate carrying process may be additionally required between substrate processing processes, or a pressure adjusting process or a temperature adjusting process may be additionally required in a process chamber, and thus, productivity in processing substrates may be decreased.

SUMMARY OF THE INVENTION

An object of the present invention is to provide a substrate processing apparatus that can reduce costs of a substrate process using plasma, so as to improve productivity in processing substrates.

According to an aspect of the present invention, there is provided a substrate processing apparatus including: a process chamber in which a substrate is processed; a first plasma generation chamber and a second plasma generation chamber provided at a side of the substrate in the process chamber, each of the first plasma generation chamber and the second plasma generation chamber separated from the process chamber; a reactive gas supply unit configured to supply a reactive gas into the first plasma generation chamber and the second plasma generation chamber; a pair of first discharge electrodes configured to generate plasma and excite the reactive gas by the plasma in the first plasma generation chamber to generate an active species of the reactive gas; a pair of second discharge electrodes configured to generate plasma and excite the reactive gas by the plasma in the second plasma generation chamber to generate the active species of the reactive gas; a first gas ejection port and a second gas ejection port provided at the first plasma generation chamber and the second plasma generation chamber, respectively, each of the first gas ejection port and the second gas ejection port being configured to eject the active species of the reactive gas to the substrate in the process chamber; and a controller configured to control the reactive as supply unit, the pair of the first discharge electrodes and the pair of the second discharge electrodes so as to perform a processing to the substrate, the processing including supplying the reactive as into the first plasma generation chamber and the second plasma generation chamber, exciting the reactive gas by the plasma to generate the active species of the reactive gas the first plasma generation chamber and the second plasma generation chamber, and simultaneously ejecting the active species from the first plasma generation chamber and the second plasma generation chamber to the substrate in the process chamber.

DETAILED DESCRIPTION OF THE PREFERRED EMBODIMENTS

<First Embodiment>

Figure 1:
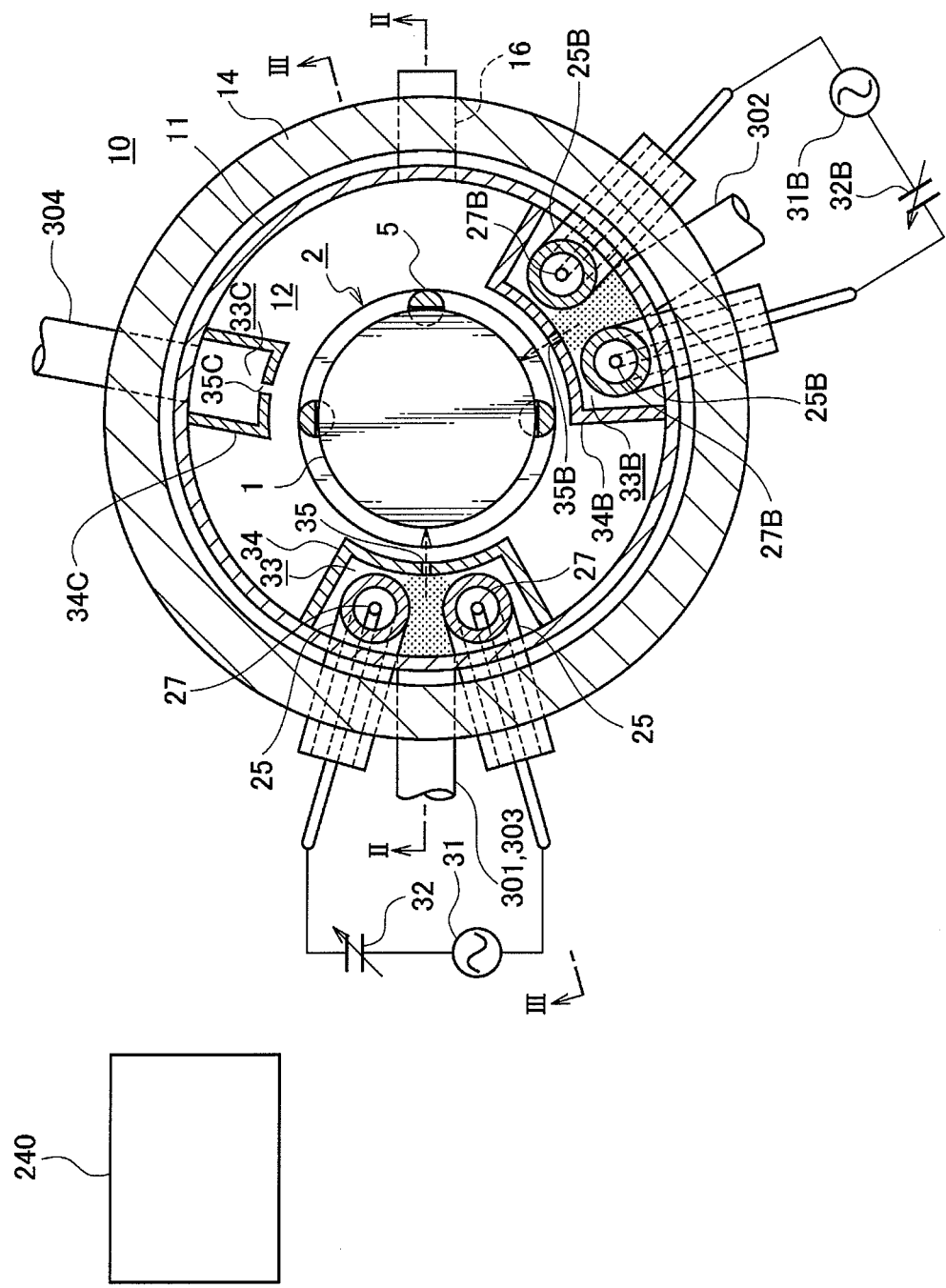
FIG. 1 is a plan cross-sectional view illustrating a process furnace of a substrate processing apparatus suitably used according to a first embodiment of the present invention.

A first embodiment of the present invention will be described hereinafter.

(1) Configuration of Substrate Processing Apparatus

FIG. 1, FIG. 2, FIG. 3, and FIG. 4 are schematic views illustrating a process furnace 10 of a substrate processing apparatus properly used according to the current embodiment.

(Process Chamber)

As shown in FIG. 1, FIG. 2, FIG. 3, and FIG. 4, the process furnace 10 of the substrate processing apparatus according to the present invention is configured as a batch type vertical hot wall type furnace. The process furnace 10 includes a reaction tube 11. The reaction tube 11 is formed in a cylindrical shape with a closed upper end and an open lower end. For example, the reaction tube 11 is made of a heat resistant material such as quartz ($SiO_2$). The reaction tube 11 is vertically disposed and fixedly supported so that the centerline of the reaction tube 11 can be vertical. The open lower end of the reaction tube 11 forms a furnace port 13 through which wafers 1 are loaded and unloaded as substrates.

At the inside of the reaction tube 11, a process chamber 12 is formed to process the wafers 1. The process chamber 12 is configured to accommodate a boat 2, which will be described later, as a substrate holder. The boat 2 includes a pair of end plates 3 and 4 at upper and lower sides, and a plurality of holding members 5 (in the current embodiment, three holding members 5) vertically installed between the end plates 3 and 4. For example, the end plates 3 and 4 and the holding members 5 are made of a heat-resistant material such as quartz or silicon carbide (SiC). At each of the holding members 5, a plurality of holding grooves 6 are arranged at regular intervals in the longitudinal direction of the holding member 5 in a manner such that the holding grooves 6 of the holding members 5 are open to face each other. In a way of inserting the edge parts of wafers 1 respectively in the holding grooves 6 of the holding members 5, the wafers 1 can be held by the boat 2 in a state where the wafers 1 are horizontally oriented and vertically arranged in multiple stages with the centers of the wafers 1 being aligned with each other.

At the lower end part of the reaction tube 11, a base 15 is installed as a holder that can air-tightly seal the open lower end of the reaction tube 11, and a seal cap 17 is installed as a furnace port cover. The base 15 is formed in a disk shape. For example, the base 15 is made of a metal such as stainless steel. On the upper surface of the base 15, a seal ring 18 is installed as a seal member contacting the lower end of the reaction tube 11. In addition, on the lower surface of the base 15, a seal ring 18 is installed as a seal member contacting the upper end of the seal cap 17. The seal cap 17 is installed under the base 15. For example, the seal cap 17 is made of a metal such as stainless steel, and formed in a disk shape. The seal cap 17 is connected to an arm of a boat elevator (not shown), and is configured to be freely moveable in the vertical direction. When the boat 2 is loaded into the process chamber 12, the seal cap 17 is configured to air-tightly seal the lower end of the reaction tube 11 through the base 15 and the seal rings 18. The boat elevator (not shown) is electrically connected to a controller 240 to be described later.

(Rotation Unit)

Near the center of the lower side of the seal cap 17, a rotation mechanism 19 configured to rotate the boat 2 is installed. A rotation shaft 19*a* of the rotation mechanism 19 passes through the seal cap 17 and the base 15, and supports an insulating barrel 7, having a cylindrical shape, from the lower side. In addition, the insulating barrel 7 supports the above-described boat 2 from the lower side. By operating the rotation mechanism 19, the wafers 1 can be rotated in the process chamber 12. In addition, for example, the insulating barrel 7 is made of a heat resistant material such as quartz or silicon carbide. The insulating barrel 7 functions as an insulating member that is configured to suppress heat transferred from a heater 14 to the lower end side of the reaction tube 11. The rotation mechanism 19 is electrically connected to the controller 240 to be described later.

(Heating Unit)

At the outside of the reaction tube 11, as a heating unit configured to entirely and uniformly heat the process chamber 12, the heater 14 is installed in a concentric circle shape to surround the reaction tube 11. The heater 14 is supported by a device frame (not shown) of the process furnace 10, so that the heater 14 is vertically fixed. Although not shown, at the device frame of the process furnace 10, a temperature sensor is installed as a temperature detector. The temperature of the heater 14 is controlled based on temperature information of the temperature sensor. The heater 14 and the temperature sensor are electrically connected to the controller 240 to be described later.

(Exhaust System)

A side wall disposed on the lower side of the reaction tube 11 is connected with a gas exhaust pipe 16. At the gas exhaust pipe 16, in order from an upstream side, a pressure sensor (not shown), a pressure control device (not shown) configured as an auto pressure controller (APC) valve, and an exhaust device (not shown) configured as a vacuum pump are installed. By exhausting the inside of the process chamber 12 by using the exhaust device, and simultaneously, by adjusting the degree of valve opening of the pressure control device according to pressure information detected by the pressure sensor, the inside of the process chamber 12 can be adjusted to a predetermined pressure. The pressure sensor, the pressure control device, and the exhaust device are electrically connected to the controller 240 to be described later.

(First Plasma Generation Chamber and First Discharge Electrodes)

In the reaction tube 11 (in the process chamber 12), at the space between an inner wall surface of the reaction tube 11 and the outer circumferences of wafers 1, a first plasma generation chamber 33 having an arc shape is installed. For example, the first plasma generation chamber 33 is separated from the process chamber 12 by a partition wall 34 having a barrel shape and the inner wall surface of the reaction tube 11. In the partition wall 34, a plurality of first gas ejection ports 35 are vertically arrayed. The number of the first gas ejection ports 35 corresponds to the number of wafers 1 to be processed. Height positions of the first gas ejection ports 35 are respectively set to face the space between vertically adjacent wafers 1 held by the boat 2.

In the first plasma generation chamber 33, a pair of protecting pipes 25 are installed. Each of the protecting pipes 25 is vertically installed to conform with the inner wall surface of the reaction tube 11. Each of the protecting pipes 25 has a bent lower end, and passes through the side surface of the reaction tube 11 and protrudes to the outside. Each of the protecting pipes 25 is configured by a dielectric. Each of the protecting pipes 25 is formed in a thin and long cylindrical pipe shape with a closed upper end and an open lower end. The inside of a hollow part of each of the protecting pipes 25 communicates with the outside (atmosphere) of the process chamber 12.

From the lower side, first discharge electrodes 27 are inserted in the protecting pipes 25, respectively. The first discharge electrodes 27 are made of a conductive material. Each of the first discharge electrodes 27 is formed in a thin and long rod shape. The lower end (exposed holding part) of each of the first discharge electrodes 27 is held in the protecting pipes 25 through an insulating unit (not shown) that can prevent discharging. To prevent oxidation of the first discharge electrodes 27 due to heating of the heater 14, a mechanism configured to purge the inside of the protecting pipes 25 with inert gas may be installed. The pair of protecting pipes 25 is not limited to the above-described shape, and thus, the upper ends of the protecting pipes 25 may be bent to pass through the upper side surface of the reaction tube 11 and protrude to the outside. In addition, the first discharge electrodes 27 may be inserted from the upper side into the protecting pipes 25, respectively.

The pair of first discharge electrodes 27 are electrically connected with an output side (secondary side) of a high frequency power source 31 through a matching device 32 configured to adjust impedance. The high frequency power source 31 and the matching device 32 are electrically connected to the controller 240 to be described later.

A first reactive gas supply unit to be described later is configured to supply $NH_3$ gas as first reactive gas and Ar gas as exciting gas into the first plasma generation chamber 33. In a state where Ar gas is supplied in the first plasma generation chamber 33, high frequency power is supplied from the high frequency power source 31 to the pair of first discharge electrodes 27, so that plasma can be generated in the first plasma generation chamber 33, and the Ar can be activated. Then, in this state, by supplying the $NH_3$ gas into the first plasma generation chamber 33, and by colliding the activated Ar (Ar radicals) with $NH_3$, the $NH_3$ can be indirectly activated. The activated $NH_3$ gas ($NH_3$ radicals) flows into the process chamber 12 through the first gas ejection ports 35, and is supplied to surfaces of the wafers 1.

(Second Plasma Generation Chamber and Second Discharge Electrodes)

In the reaction tube 11 (in the process chamber 12), at the space between the inner wall surface of the reaction tube 11 and the outer circumferences of wafers 1, a second plasma generation chamber 33B having an arc shape is installed. In a same manner as that of the first plasma generation chamber 33, for example, the second plasma generation chamber 33B is separated from the process chamber 12 by the partition wall 34 having a barrel shape and the inner wall surface of the reaction tube 11. In the partition wall 34B, a plurality of second gas ejection ports 35B are vertically arrayed. The number of the second gas ejection ports 35B corresponds to the number of wafers 1 to be processed. Height positions of the second gas ejection ports 35B are respectively set to face the space between vertically adjacent wafers 1 held by the boat 2.

In a same manner as the inside of the first plasma generation chamber 33, at the inside of the second plasma generation chamber 33B, a pair of protecting pipes 25B are installed. Each of the protecting pipes 25B is vertically installed to conform with the inner wall surface of the reaction tube 11. Each of the protecting pipes 25B has a bent lower end, and passes through the side surface of the reaction tube 11 and protrudes to the outside. Each of the protecting pipes 25B is configured by a dielectric. Each of the protecting pipes 25B is formed in a thin and long cylindrical pipe shape with a closed upper end and an open lower end. The inside of a hollow part of each of the protecting pipes 25B communicates with the outside (atmosphere) of the process chamber 12.

In a same manner as the inside of the protecting pipes 25, from the lower side, second discharge electrodes 27B are inserted in the protecting pipes 25B, respectively. The second discharge electrodes 27B are made of a conductive material. Each of the second discharge electrodes 27B is formed in a thin and long rod shape. The lower end (exposed holding part) of each of the second discharge electrodes 27B is held in the protecting pipes 25B through an insulating unit (not shown) that can prevent discharging. To prevent oxidation of the second discharge electrodes 27B due to heating of the heater 14, a mechanism configured to purge the inside of the protecting pipes 25B with inert gas may be installed. As in the first plasma generation chamber 33, the upper ends of the pair of protecting pipes 25B in the second plasma generation chamber 33B may be bent to pass through the upper side surface of the reaction tube 11 and protrude to the outside. In addition, the second discharge electrodes 27B may be inserted from the upper side into the protecting pipes 25B, respectively.

The pair of second discharge electrodes 27B are electrically connected with an output side (secondary side) of a high frequency power source 31B through a matching device 32B configured to adjust impedance. The high frequency power source 31B and the matching device 32B are electrically connected to the controller 240 to be described later.

A second reactive gas supplying unit to be described later is configured to supply $O_2$ gas as second reactive gas into the second plasma generation chamber 33B. In a state where $O_2$ gas is supplied in the second plasma generation chamber 33B, high frequency power is supplied from the high frequency power source 31B to the pair of second discharge electrodes 27B, so that plasma can be generated in the second plasma generation chamber 33B, and the $O_2$ gas can be activated. The activated $O_2$ gas ($O_2$ radicals) flows into the process chamber 12 through the second gas ejection ports 35B, and is supplied to the surfaces of the wafers 1.

(Buffer Chamber)

In addition, in the reaction tube 11 (in the process chamber 12), at the space between the inner wall surface of the reaction tube 11 and the outer circumferences of wafers 1, a buffer chamber 33C having an arc shape is installed. For example, the buffer chamber 33C is separated from the process chamber 12 by a partition wall 34C having a barrel shape and the inner wall surface of the reaction tube 11. In the partition wall 34C, a plurality of third gas ejection ports 35C are arrayed to face the spaces between vertically arrayed wafers 1. The number of the third gas ejection ports 35C corresponds to the number of wafers 1 to be processed. Height positions of the third gas ejection ports 35C are respectively set to face the spaces between vertically adjacent wafers 1 held by the boat 2.

The inside of the buffer chamber 33C is provided with dichlorosilane ($SiH_2Cl_2$, referred to as DCS hereinafter) gas as source gas by using a source gas supply unit to be described later. The buffer chamber 33C functions as a gas dispersion space configured to disperse DCS gas to obtain a uniform concentration through buffering. The DCS gas supplied in the buffer chamber 33C flows into the process chamber 12 through the third gas ejection ports 35C, and is supplied to the surfaces of the wafers 1.

(Gas Supply Unit)

The lower part of the side wall of the reaction tube 11 is connected with a first reactive gas supply pipe 301 that is configured to supply $NH_3$ gas as the first reactive gas into the first plasma generation chamber 33. At the first reactive gas supply pipe 301, in order from an upstream side, a gas cylinder 301a that is a supply source of $NH_3$ gas, a mass flow controller 301b that is a flow rate controller (flow rate control unit), and a valve 301c that is an opening and closing valve are installed. $NH_3$ gas supplied from the gas cylinder 301a is adjusted to a predetermined flow rate by the mass flow controller 301b, and is allowed to flow in the first reactive gas supply pipe 301 by an opening operation of the valve 301c, and is supplied into the first plasma generation chamber 33.

In addition, the lower part of the side wall of the reaction tube 11 is connected with a second reactive gas supply pipe 302 that is configured to supply $O_2$ gas as the second reactive gas into the second plasma generation chamber 33B. At the second reactive gas supply pipe 302, in order from an upstream side, a gas cylinder 302a that is a supply source of $O_2$ gas, a mass flow controller 302b that is a flow rate controller (flow rate control unit), and a valve 302c that is an opening and closing valve are installed. $O_2$ gas supplied from the gas cylinder 302a is adjusted to a predetermined flow rate by the mass flow controller 302b, and is allowed to flow in the second reactive gas supply pipe 302 by an opening operation of the valve 302c, and is supplied into the second plasma generation chamber 33B.

In addition, the lower part of the side wall of the reaction tube 11 is connected with a source gas supply pipe 304 that is configured to supply DCS gas as the source gas into the buffer chamber 33C. At the source gas supply pipe 304, in order from an upstream side, a gas cylinder 304a that is a supply source of DCS gas, a mass flow controller 304b that is a flow rate controller (flow rate control unit), a valve 304c that is an opening and closing valve, and a valve 304d that is an opening and closing valve are installed. A gas stagnant part 304e is configured between the valve 304c and the valve 304d. DCS gas supplied from the gas cylinder 304a is adjusted to a predetermined flow rate by the mass flow controller 304b, and is allowed to flow in the source gas supply pipe 304 by an opening operation of the valve 304c, and is supplied into the buffer chamber 33C. The valve 304c is opened in the state where the valve 304d is closed, and the opening state of the valve 304c is held for a predetermined time, and then, when the pressure of DCS gas in the gas stagnant part 304e reaches a predetermined pressure, the valve 304c is closed, and the valve 304d is opened, so that the DCS gas can be supplied in a pulsed manner (flush supply) into the buffer chamber 33C (into the process chamber 12). A ratio of the inner volume of the gas stagnant part 304e to the inner volume of the process chamber 12, for example, may range from $1/1000$ to $3/1000$. When the process chamber 12 has an inner volume of 100 liters, the gas stagnant part 304e may have an inner volume ranging from 100 cc to 300 cc. A path of the source gas from the gas stagnant part 304e to the process chamber 12, for example, may have a flow conductance of $1.5 \times 10^{-3}$ m$^3$/s or greater.

A downstream side of the valve 301c of the first reactive gas supply pipe 301, a downstream side of the valve 302c of the second reactive gas supply pipe 302, and a downstream side of the valve 304d of the source gas supply pipe 304 are connected respectively through a valve 303c, a valve 303d, and a valve 303e to a downstream end of an Ar gas supply pipe 303 configured to supply, for example, Ar gas functioning as exciting gas, purge gas, or carrier gas. That is, the Ar gas supply pipe 303 is branched into three parts at a downstream side. At an upstream side of the Ar gas supply pipe 303 with respect to the branched parts, in order from the upstream side, a gas cylinder 303a that is a supply source of the Ar gas, and a mass flow controller 303b that is a flow rate controller (flow rate control unit) are installed. Ar gas supplied from the gas cylinder 303a is adjusted to a predetermined flow rate by the mass flow controller 303b, and is allowed to flow in the first reactive gas supply pipe 301 by an opening operation of the valve 303c, and is supplied into the first plasma generation chamber 33. The Ar gas is also allowed to flow in the second reactive gas supply pipe 302 by an opening operation of the valve 303d, and is supplied into the second plasma generation chamber 33B. The Ar gas is also allowed to flow in the source gas supply pipe 304 by an opening operation of the valve 303e, and is supplied into the buffer chamber 33C.

Mainly, the first reactive gas supply unit is configured by the first reactive gas supply pipe 301, the gas cylinder 301a, the mass flow controller 301b, the valve 301c, the Ar gas supply pipe 303, the gas cylinder 303a, the mass flow controller 303b, and the valve 303c. In addition, mainly, a second reactive gas supply unit is configured by the second reactive gas supply pipe 302, the gas cylinder 302a, the mass flow controller 302b, the valve 302c, the Ar gas supply pipe 303, the gas cylinder 303a, the mass flow controller 303b, and the valve 303d. In addition, mainly, a source gas supply unit is configured by the source gas supply pipe 304, the gas cylinder 304a, the mass flow controller 304b, the valve 304c, the valve 304d, the Ar gas supply pipe 303, the gas cylinder 303a, the mass flow controller 303b, and the valve 303e.

In addition, an exciting gas supply unit is configured by the Ar gas supply pipe 303, the gas cylinder 303a, the mass flow controller 303b, and the valves 303c, 303d, and 303e.

The mass flow controllers 301b, 302b, 303b, and 304b, and the valves 301c, 302c, 303c, 304c, 303d, 303e, and 304d are respectively and electrically connected to the controller 240 to be described later.

(Control Unit)

As described above, the controller 240 as a control unit is respectively and electrically connected to the rotation mechanism 19, the boat elevator (not shown), the heater 14, the temperature sensor (not shown), the pressure sensor (not shown), the pressure control device (not shown), the exhaust device (not shown), the high frequency power sources 31 and 31B, the matching devices 32 and 32B, the mass flow controllers 301b, 302b, 303b, and 304b, and the valves 301c, 302c, 303c, 304c, 303d, 303e, and 304d, and mainly controls the whole substrate processing apparatus.

In detail, the controller 240 controls the rotation shaft 19a of the rotation mechanism 19 to rotate at a predetermined time. The controller 240 controls the boat elevator to move upward and downward at a predetermined time. In addition, the controller 240 adjusts the degree of valve opening of the pressure control device based on pressure information detected by the pressure sensor, and controls the inside of the process chamber 12 to reach a predetermined pressure at a predetermined time. In addition, the controller 240 adjusts power supplied to the heater 14 based on temperature information detected by the temperature sensor, and controls the inside of the process chamber 12 to achieve a predetermined temperature distribution at a predetermined time, thus controlling wafers 1 disposed in the process chamber 12 to reach a predetermined temperature. In addition, the controller 240 controls the high frequency power source 31 and 31B and the matching devices 32 and 32B, so that plasma can be generated at a predetermined time in the first plasma generation chamber 33 and the second plasma generation chamber 33B. In addition, the controller 240 controls the mass flow controllers 301b, 302b, 303b, and 304b for flow rates, and simultaneously, controls the opening and closing of the valves 301c, 302c, 303c, 304c, 303d, 303e, and 304d, so as to start or stop supplying gas at predetermined flow rates at predetermined times into the first plasma generation chamber 33, into the second plasma generation chamber 33B, and into the buffer chamber 33C.

The controller 240 according to the current embodiment is configured to continuously perform: a first substrate processing operation in which the first reactive gas is supplied into the first plasma generation chamber 33 from a first gas supply system, and plasma is generated in the first plasma generation chamber 33 by using the first discharge electrodes 27, so as to directly or indirectly excite the first reactive gas for generating an active species of the first reactive gas, and wafers 1 are processed by using the generated active species of the first reactive gas; and a second substrate processing operation in which the second reactive gas is supplied into the second plasma generation chamber 33B from a second gas supply system, and plasma is generated in the second plasma generation chamber 33B by using the second discharge electrodes 27B, so as to directly or indirectly excite the second reactive gas for generating an active species of the second reactive gas, and wafers 1 are processed by using the generated active species of the second reactive gas.

(2) Substrate Processing Process

Next, by using the process furnace 10 according to the above-described configuration, as one of processes of manufacturing a semiconductor device, a process of continuously performing both a nitride operation in which a surface of a wafer 1 is nitrided to form a silicon nitride (SiN) film, and an oxidation operation in which the wafer 1 provided with the SiN film is oxidized to form a silicon oxide nitride (SiON) film, for example, a substrate processing process in which a gate insulating film of a metal oxide semiconductor (MOS) type field effect transistor is formed will now be described. In the following description, operations respectively of parts constituting the substrate processing apparatus are controlled by the controller 240.

(Loading Operation S1)

Figure 2:
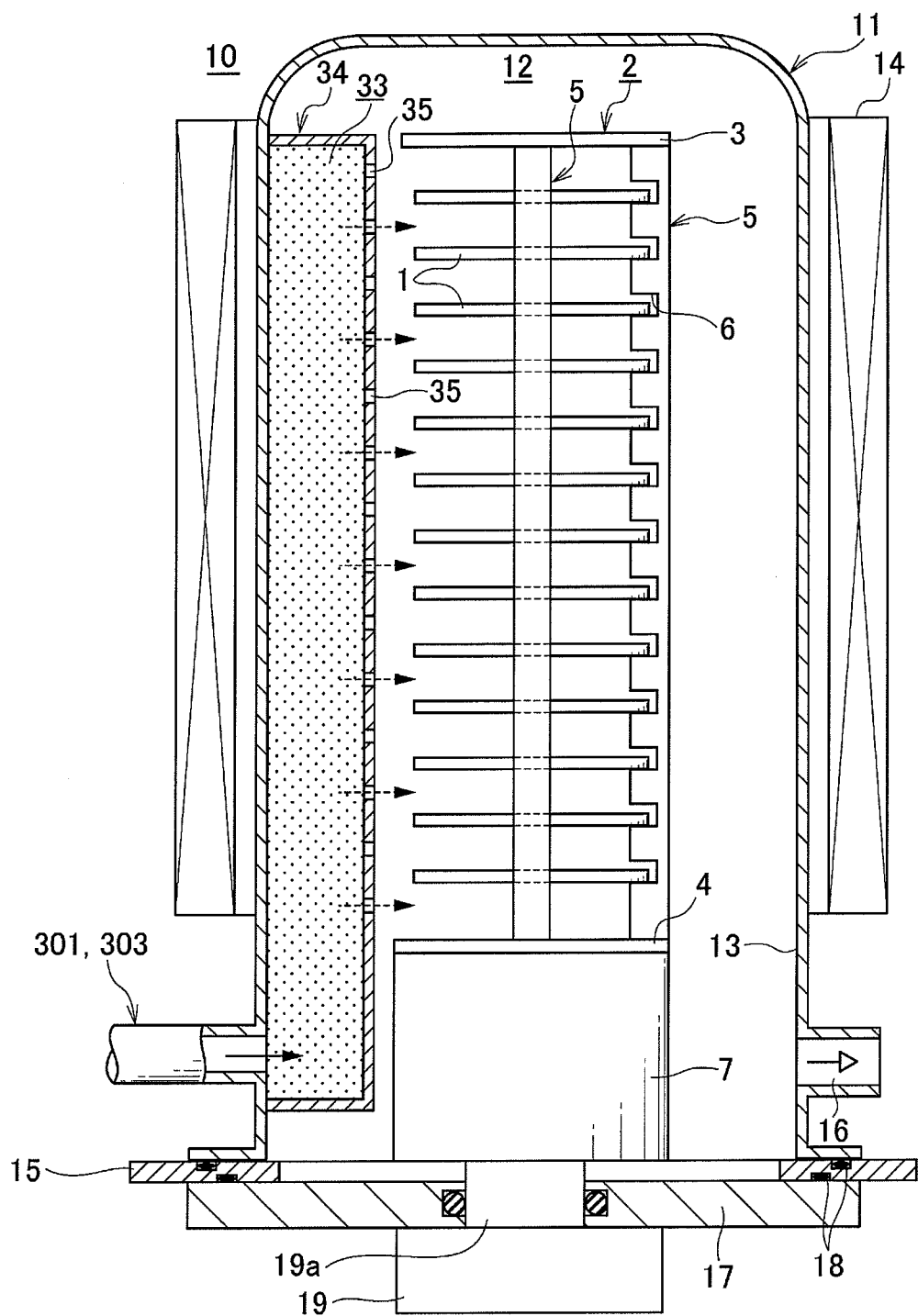
FIG. 2 is a vertical cross-sectional view taken along line II-II of FIG. 1.
Figure 3:
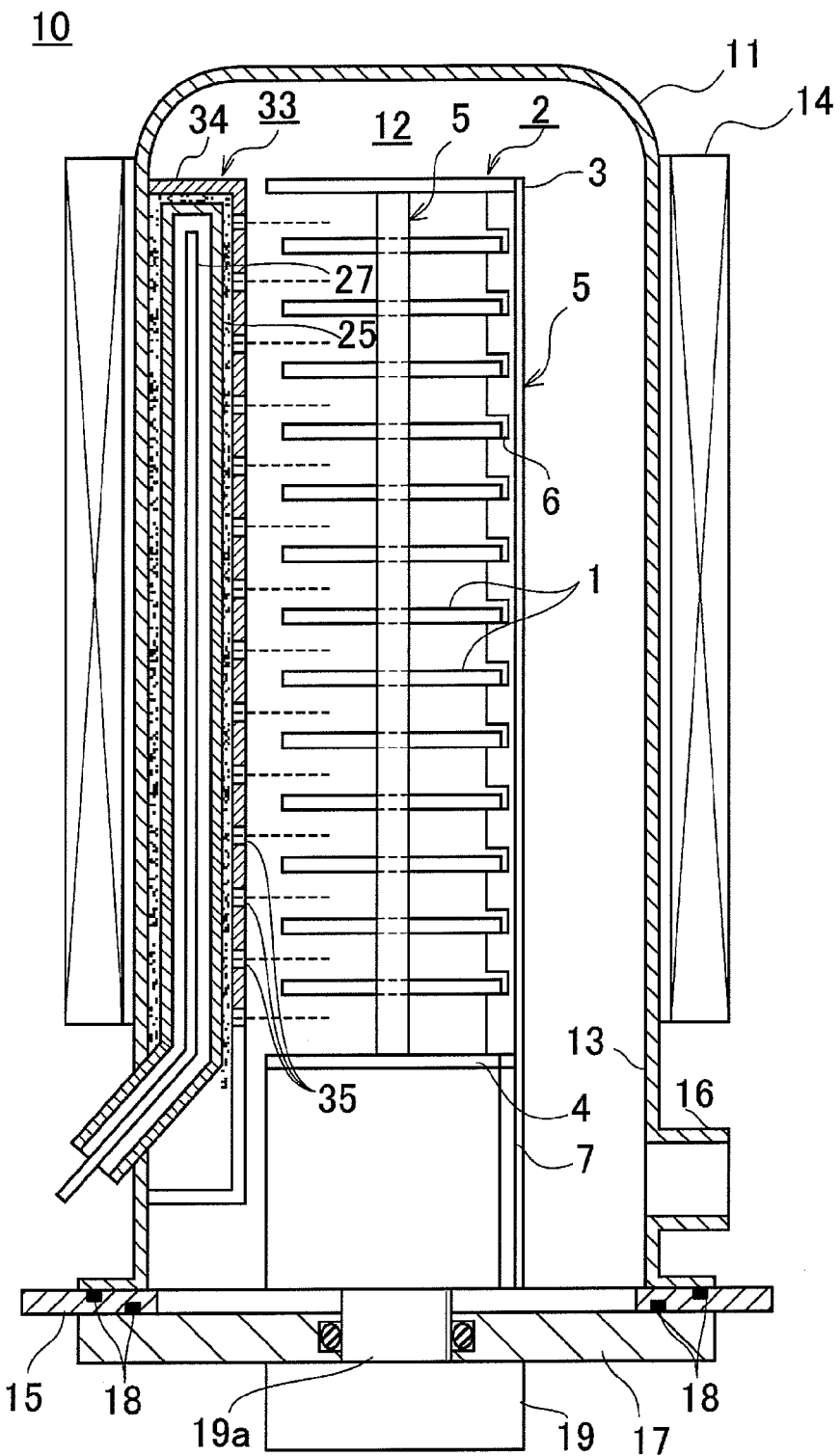
FIG. 3 is a vertical cross-sectional view taken along line of FIG. 1.
Figure 4:
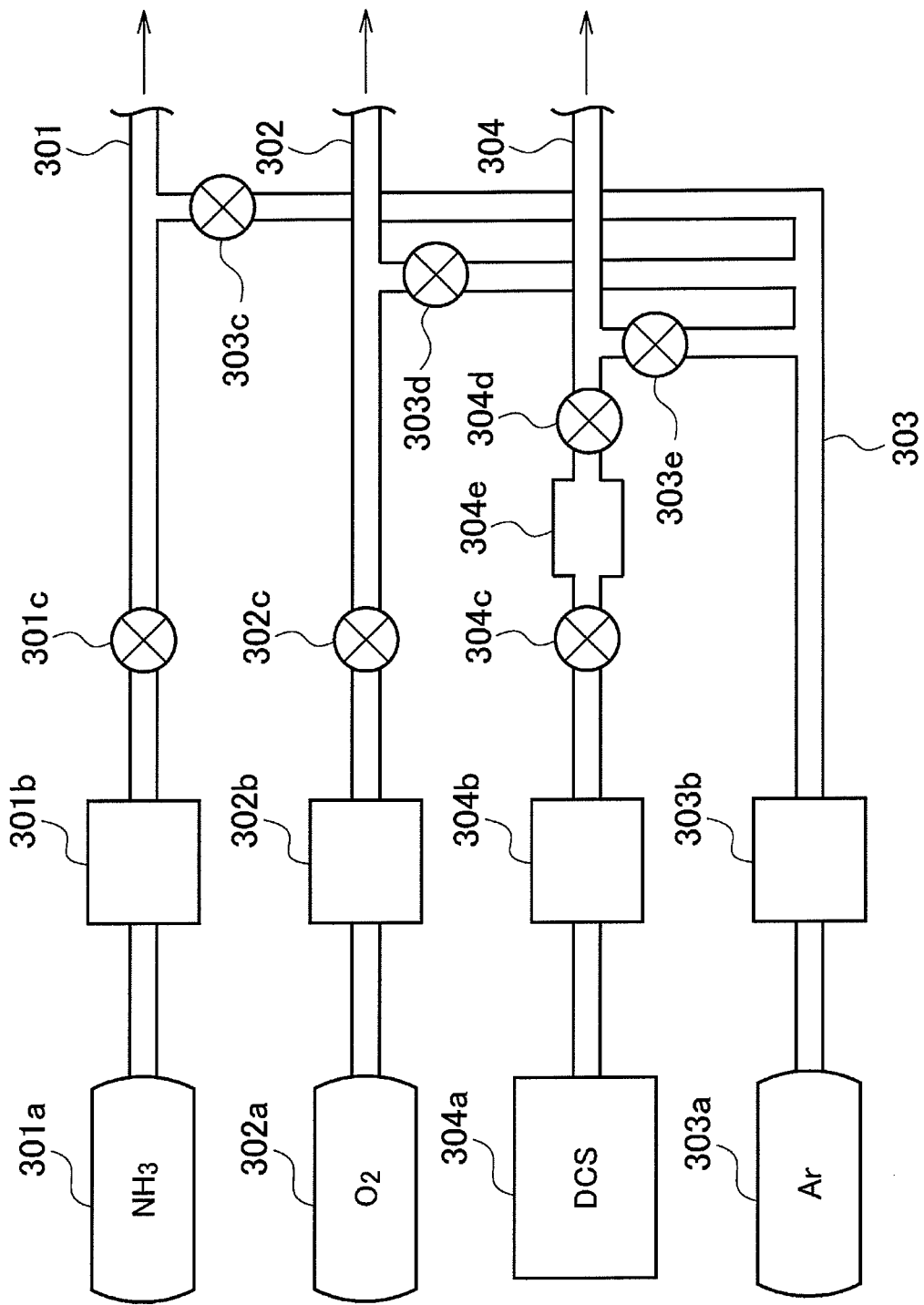
FIG. 4 is a schematic view illustrating a gas supply system connected to the process furnace of FIG. 1.

First, the boat 2 is charged with a plurality of wafers 1 (wafer charging). Next, based on a control of the controller 240, the boat elevator is driven to move the boat 2 upward. Accordingly, as shown in FIG. 1, FIG. 2, and FIG. 3, the boat 2 holding the plurality of wafers 1 is loaded into the process chamber 12 (boat loading). At this time, the seal cap 17 closes the lower end of the reaction tube 11 through the base 15 and the seal rings 18. Accordingly, the process chamber 12 is air-tightly sealed.

In addition, when the boat 2 is loaded, Ar gas as purge gas is brought to flow into the process chamber 12. In detail, the flow rate of the Ar gas is adjusted by the mass flow controller 303b, and simultaneously, the valve 303c is opened, so as to introduce the Ar gas into the process chamber 12. Accordingly, when carrying of the boat 2 is performed, the invasion of particles into the process chamber 12 can be suppressed.

(Pressure Adjusting Operation and Temperature Increasing Operation S2)

When the loading of the boat 2 into the process chamber 12 is completed, the inner atmosphere of the process chamber 12 is exhausted such that the inside of the process chamber 12 reaches a predetermined pressure (for example, 10 Pa to 100 Pa). In detail, while the inner atmosphere of the process chamber 12 is exhausted by the exhaust device, the degree of the valve opening of the pressure control device is feedback controlled based on pressure information detected by the pressure sensor, and the inside of the process chamber 12 reaches a predetermined pressure. In addition, the heater 14 heats the inside of the process chamber 12 to a predetermined temperature. In detail, power supplied to the heater 14 is controlled based on temperature information detected by the temperature sensor, the inside of the process chamber 12 reaches at a predetermined temperature (for example, 300° C. to 600° C.). In addition, the rotation mechanism 19 is operated to start the rotation of the wafers 1 loaded in the process chamber 12. The rotation of the wafers 1 is continually performed until a nitride operation S3 and an oxidation operation S4, which will be described later, are finished.

(Nitride Operation S3)

In the nitride operation S3, according to an atomic layer deposition (ALD) method that is one of chemical vapor deposition methods, the DCS gas and the $NH_3$ gas are used to form the silicon nitride (SiN) films on the surfaces of the wafers 1. The ALD method is a method in which two or more types of processing gas are alternately supplied one by one onto wafers 1 under predetermined film forming conditions (temperature, time, etc.), and surface reactions of the processing gas on the wafers 1 are used to form thin films including less than one atomic layer to several atomic layers. In the ALD method, a film thickness can be controlled by controlling the number of cycles for supplying processing gas. For example, if the film forming rate is 1 Å/cycle and it is intended to form a 20-Å film, the process may be repeated 20 cycles.

In the nitride operation S3, first, an active species ($NH_3$ radicals) generated by indirectly exciting the $NH_3$ gas as the first reactive gas in the first plasma generation chamber 33 is supplied into the process chamber 12, and is brought to surface-react (chemical adsorption) with surface parts of the wafers 1 (first reactive gas supply operation S31). Thereafter, the DCS gas is supplied from the buffer chamber 33C to the inside of the process chamber 12, and is brought to surface-react (chemical adsorption) with $NH_3$ chemically adsorbed to the surfaces of the wafers 1, so as to form SiN films including less than one atomic layer to several atomic layers (source gas supply operation S32). The first reactive gas supply operation S31 and the source gas supply operation S32 are set as one cycle, and the cycle is repeated predetermined times to form SiN films having a desired thickness. Hereinafter, the nitride operation S3 will be described in detail.

(First Reactive Gas Supply Operation S31)

First, the Ar gas is supplied as the exciting gas into the first plasma generation chamber 33. In detail, the flow rate of the Ar gas is adjusted by using the mass flow controller 303b, and simultaneously, the valve 303c is opened, so as to supply the Ar gas into the first plasma generation chamber 33. Then, high frequency power is supplied from the high frequency power source 31 to the pair of first discharge electrodes 27, so that Ar gas plasma is generated in the first plasma generation chamber 33, and Ar is activated.

Next, the $NH_3$ gas is supplied as the first reactive gas into the first plasma generation chamber 33. In detail, the flow rate of the $NH_3$ gas is adjusted, for example, within a range from 1 slm to 10 slm by using the mass flow controller 301b, and simultaneously, the valve 301c is opened, so as to supply the $NH_3$ gas into the first plasma generation chamber 33. The $NH_3$ gas supplied in the first plasma generation chamber 33 collides with the activated Ar (Ar radicals), and is indirectly activated. From the first gas ejection ports 35 toward the wafers 1, the activated $NH_3$ ($NH_3$ radicals) and the Ar radicals are ejected together, and are supplied into the process chamber 12.

The $NH_3$ radicals supplied into the process chamber 12 are brought to contact with the surfaces of the wafers 1 to undergo the surface reaction, and the $NH_3$ are chemically adsorbed to the surfaces of the wafers 1. $NH_3$ gas and Ar gas, which have not contributed to the adsorption to the surfaces of the wafers 1, flow down within the process chamber 12, and are exhausted out of the gas exhaust pipe 16. As such, the Ar gas functions as the exiting gas for indirectly activating the $NH_3$, and simultaneously, functions as the carrier gas for facilitating the supplying of the $NH_3$ radicals into the process chamber 12.

After a predetermined time (for example, 2 seconds to 120 seconds) is elapsed, the supplying of the high frequency power from the high frequency power source 31 to the pair of first discharge electrodes 27 is stopped. In addition, the valve 301c is closed to stop the supplying of the $NH_3$ gas into the first plasma generation chamber 33. In addition, the inside of the process chamber 12 is exhausted to reach, for example, 20 Pa or less. Meanwhile, after the valve 301c is closed, the valve 303c is opened, and Ar gas is supplied as the purge gas into the process chamber 12, so that the $NH_3$ gas remaining in the process chamber 12 can be effectively exhausted.

(Source Gas Supply Operation S32)

Together with the performing of the first reactive gas supply operation S31, the inside of the gas stagnant part 304e of the source gas supply pipe 304 is filled with the DCS gas. In detail, first, in the state where the valve 304d is closed, the valve 304c is opened, and the mass flow controller 304b is used to adjust the DCS gas to have a predetermined flow rate, and simultaneously, to start supplying the DCS gas as the source gas into the gas stagnant part 304e.

Then, after a predetermined time (for example, 2 seconds to 4 seconds) is elapsed, when the inner pressure of the gas stagnant part 304e reaches a predetermined pressure (for example, 20000 Pa), the valve 304c is closed to confine the DCS gas under high pressure in the gas stagnant part 304e.

When the inside of the process chamber 12 reaches a predetermined pressure (for example, 20 pa), and the inside of the gas stagnant part 304e reaches a predetermined pressure (for example, 20000 Pa), a valve of the pressure control device (not shown) is closed to temporally stop the exhausting of the inside of the process chamber 12. Then, in the state where the valve 304c is closed, the valve 304d is opened, and the high pressure DCS gas filling the inside of the gas stagnant part 304e is supplied in the pulsed manner (flush supply) into the buffer chamber 33C (that is, into the process chamber 12). At this time, since the valve of the pressure control device (not shown) has been closed, the inner pressure of the process chamber 12 is quickly increased, for example, to 931 Pa (7 Torr). The DCS gas supplied into the process chamber 12 is brought to contact with the surfaces of the wafers 1, and to surface-react with the $NH_3$ chemically adsorbed to the surface parts of the wafers 1, so as to form SiN films, including less than one atomic layer to several atomic layers, on the surfaces of the wafers 1. $NH_3$ gas, which has not contributed to the formation of the SiN films, flows down within the process chamber 12, and is exhausted out of the gas exhaust pipe 16.

After a predetermined time (for example, 2 seconds to 4 seconds) is elapsed, the valve 304d is closed to stop the supplying of the DCS gas into the buffer chamber 33C (that is, into the process chamber 12). In addition, after the valve 304d is closed, the valve 303e is opened to supply the Ar gas as the purge gas into the process chamber 12, so that the DCS gas or reaction products remaining in the process chamber 12 can be efficiently exhausted.

Thereafter, the first reactive gas supply operation S31 and the source gas supply operation S32 are set as one cycle, and the cycle is repeated predetermined times to form SiN films having a desired thickness.

(Oxidation Operation S4)

After forming the SiN films having a desired thickness through the nitride operation S3, an active species ($O_2$ radicals) of oxygen gas activated by plasma is supplied on the wafers 1 to oxidize the SiN films, thus performing the oxidation operation S4 in which silicon oxide nitride (SiON) films are formed.

In addition, in the current embodiment, at the inside of the process chamber 12, in the second plasma generation chamber 33B installed independently from the first plasma generation chamber 33, the $O_2$ radicals are generated. That is, in the current embodiment, the nitride operation S3 and the oxidation operation S4 are continuously performed using the identical process furnace 10, so as to prevent wafers 1 from being unloaded out of the process chamber 12 between the nitride operation S3 and the oxidation operation S4. Hereinafter, the oxidation operation S4 will be described in detail.

First, the $O_2$ gas is supplied as the second reactive gas into the second plasma generation chamber 33B. In detail, the flow rate of the $O_2$ gas is adjusted by using the mass flow controller 302b, and simultaneously, the valve 302c is opened, so as to supply the $O_2$ gas into the second plasma generation chamber 33B. Then, high frequency power is supplied from the high frequency power source 31B to the pair of second discharge electrodes 27B, so that $O_2$ gas plasma is generated in the second plasma generation chamber 33B, and $O_2$ is directly activated. The activated $O_2$ ($O_2$ radicals) is ejected together with the Ar gas from the second gas ejection ports 35B to the wafers 1, and is supplied into the process chamber 12. Meanwhile, the flow rate of the Ar gas is adjusted by using the mass flow controller 303b, and simultaneously, the valve 303d is opened to supply the Ar gas as the carrier gas into the second plasma generation chamber 33B (that is, into the process chamber 12), so that the supplying of the $O_2$ radicals into the process chamber 12 can be facilitated.

The $O_2$ radicals supplied into the process chamber 12 are brought to contact with the SiN films formed on the surfaces of the wafers 1 so as to form the SiON films on the wafers 1. Thereafter, the $O_2$ gas or the Ar gas introduced into the process chamber 12 flows down in the process chamber 12, and is exhausted out of the gas exhaust pipe 16.

After a predetermined time is elapsed, the valve 302c is closed to stop the supplying of the $O_2$ gas into the second plasma generation chamber 33B. Meanwhile, after the valve 302c is closed, the valve 303d is opened to supply the Ar gas as the purge gas into the process chamber 12, so that the $O_2$ gas remaining in the process chamber 12 can be efficiently exhausted.

(Atmospheric Pressure Return Operation and Temperature Decreasing Operation S5)

When the oxidation operation S4 is completed, the rotation of the boat 2 is stopped to stop the rotation of the wafers 1. Then, the inner pressure of the process chamber 12 is returned to the atmospheric pressure, and simultaneously, the temperature of the wafers 1 is decreased. In detail, the valve 303c is opened, and the Ar gas is supplied into the process chamber 12, and simultaneously, the degree of the valve opening of the exhaust device is feedback controlled based on pressure information detected by the pressure sensor, so as to increase the inner pressure of the process chamber 12 to the atmospheric pressure. In addition, the amount of power supplied to the heater 14 is controlled, and the temperature of the wafers 1 is decreased.

(Unloading Operation S6)

Thereafter, in the reverse sequence to that of the above-described loading operation, the processed wafers 1 are unloaded from the inside of the process chamber 12, so as to end the substrate processing process according to the current embodiment.

(3) Effects Relevant to the Current Embodiment

According to the current embodiment, one or more effects are attained as follows.

(a) According to the current embodiment, the first plasma generation chamber 33 and the second plasma generation chamber 33B are installed in the process chamber 12. Thus, the nitride operation S3 and the oxidation operation S4 can be performed using the identical process furnace 10. In addition, between the nitride operation S3 and the oxidation operation S4, it is unnecessary to unload the wafers 1 out of the process chamber 12. That is, without replacing wafers, a plurality of types of substrate processing operations can be performed by using one substrate processing apparatus. Accordingly, costs for processing substrates are reduced to improve productivity in processing substrates.

(b) In the nitride operation S3 according to the current embodiment, the nitride operation is performed using the $NH_3$ gas ($NH_3$ radicals) that is activated by plasma. In addition, in the oxidation operation S4 according to the current embodiment, the oxidation operation is performed using the $O_2$ gas ($O_2$ radicals) that is activated by plasma. As such, since a substrate processing operation such as the nitride operation or the oxidation operation is performed using the active species activated by plasma, the process temperature of the wafers 1 can be decreased (for example, to a range from 300° C. to 600° C.).

(c) In the nitride operation S3 according to the current embodiment, the first reactive gas supply operation S31 and the source gas supply operation S32 are set as one cycle, and the cycle is repeated predetermined times to form SiN films having a desired thickness. That is, without simultaneously supplying the DCS gas and the $NH_3$ gas ($NH_3$ radicals) activated by plasma, and without mixing of the DCS gas and the $NH_3$ gas, the DCS gas and the $NH_3$ gas are supplied into the process chamber 12. As a result, the occurrence of a gas-phase reaction can be suppressed in the process chamber 12, and the formation of particles in the process chamber 12 can be suppressed.

(d) In the first reactive gas supply operation S31 according to the current embodiment, the activated $NH_3$ ($NH_3$ radicals) is supplied together with the Ar radicals into the process chamber 12. Accordingly, the service life of the $NH_3$ radicals is extended, and the amount of the $NH_3$ radicals supplied to the wafers 1 is increased, so that the speed of the nitride operation can be increased.

(e) In the source gas supply operation S32 according to the current embodiment, the high pressure DCS gas filling the inside of the gas stagnant part 304e is supplied in the pulsed manner (flush supply) into the buffer chamber 33C (that is, into the process chamber 12). In addition, at this time, since the valve of the pressure control device (not shown) has been closed, the inner pressure of the process chamber 12 is quickly increased, for example, to 931 Pa (7 Torr). Accordingly, the supplying of the DCS to the surfaces of the wafers 1 can be performed more reliably for a short time.

<Second Embodiment>

In the above-described embodiment, the different types of reactive gas are supplied respectively in the first plasma generation chamber 33 and the second plasma generation chamber 33B, and plasma is generated respectively under the different conditions, and the different substrate operations (the nitride operation S3 and the oxidation operation S4) are sequentially performed. However, the present invention is not limited thereto. For example, an identical type of reactive gas may be supplied into the first plasma generation chamber 33 and the second plasma generation chamber 33B, and plasma in the first plasma generation chamber 33 and plasma in the second plasma generation chamber 33B may be simultaneously generated under an identical condition, thereby performing a predetermined substrate operation (for example, any one of the nitride operation S3 and the oxidation operation S4). That is, the first reactive gas and the second reactive gas may be identical in type.

For example, when both the first plasma generation chamber 33 and the second plasma generation chamber 33B are used to perform the nitride operation S3, the downstream end of the first reactive gas supply pipe 301 is branched into two parts, and the two parts are connected to the first plasma generation chamber 33 and the second plasma generation chamber 33B, respectively.

In addition, in the first reactive gas supply operation S31, the flow rate of the Ar gas is adjusted by using the mass flow controller 303b, and simultaneously, the valve 303c is opened, so as to supply the Ar gas to the first plasma generation chamber 33 and the second plasma generation chamber 33B. In addition, high frequency power is supplied from the high frequency power source 31 to the pair of first discharge electrodes 27, and simultaneously, high frequency power is supplied from the high frequency power source 31B to the pair of second discharge electrodes 27B, thus simultaneously generating Ar gas plasma in the first plasma generation chamber 33 and the second plasma generation chamber 33B, and activating Ar.

Next, $NH_3$ gas is adjusted to a predetermined flow rate by using the mass flow controller 301b, and simultaneously, the valve 301c is opened, so as to simultaneously supply the $NH_3$ gas into the first plasma generation chamber 33 and the second plasma generation chamber 33B. The $NH_3$ gas supplied in the first plasma generation chamber 33 and the second plasma generation chamber 33B collides with the activated Ar (Ar radicals), and is indirectly activated. The activated $NH_3$ ($NH_3$ radicals) is ejected together with the Ar radicals from the first gas ejection ports 35 and the second gas ejection ports 35B to wafers 1, and is supplied into the process chamber 12. The $NH_3$ radicals supplied in the process chamber 12 are brought to contact with the surfaces of the wafers 1 to undergo surface reaction, and the $NH_3$ is chemically adsorbed to the surfaces of the wafers 1.

After a predetermined time is elapsed, the supplying of the high frequency power from the high frequency power source 31 to the pair of first discharge electrodes 27 is stopped, and simultaneously, the supplying of the high frequency power from the high frequency power source 31B to the pair of second discharge electrodes 27B is stopped. In addition, the valve 301c is closed to stop the supplying of the $NH_3$ gas into the first plasma generation chamber 33 and the second plasma generation chamber 33B. In addition, the inside of the process chamber 12 is exhausted to reach, for example, 20 Pa or less. Meanwhile, after the valve 301c is closed, the valve 303c is opened to supply the Ar gas as the purge gas into the process chamber 12, so that the $NH_3$ gas remaining in the process chamber 12 can be efficiently exhausted.

Thereafter, the first reactive gas supply operation S31 and the source gas supply operation S32 are set as one cycle, and the cycle is repeated predetermined times to form SiN films having a desired thickness.

According to the current embodiment, the supplying of the $NH_3$ radicals into the process chamber 12 are simultaneously performed using both the first gas ejection ports 35 and the second gas ejection ports 35B. Thus, compared to a case in which one type of gas ejection ports is used, the supplying of the $NH_3$ radicals is performed more uniformly in the surfaces of the wafers 1. That is, the number of gas ejection ports to the process chamber 12 increases two times, and the amount of the $NH_3$ radicals ejected from one gas ejection port into the process chamber 12 decreases, and simultaneously, the active species of the reactive gas is ejected from two directions in a planar direction, and thus, more accurate film forming uniformity can be obtained. In addition, since the chemical adsorption of the $NH_3$ to the surfaces of the wafers 1 is performed more uniformly in the surfaces of the wafers 1, more uniform thickness distribution or quality of the SiN film can be achieved in the surfaces of the wafers 1.

Even when the first plasma generation chamber 33 and the second plasma generation chamber 33B are used to perform the oxidation operation S4, the above-described effects can be attained. In this case, the downstream end of the second reactive gas supply pipe 302 is branched into two parts, and the two parts are connected to the first plasma generation chamber 33 and the second plasma generation chamber 33B, respectively.

<Other Embodiments of the Present Invention>

While the embodiments of the present invention have been particularly described, various changes in form and details may be made without departing from the spirit and scope of the present invention.

For example, the present invention is not limited to a substrate processing apparatus including a vertical type process furnace according to the current embodiment, but may be suitably applicable to a substrate processing apparatus including a single substrate type process furnace, a hot wall type process furnace, or a cold wall type process furnace. In addition, the present invention is not limited to a case in which the $NH_3$ gas as the first reactive gas, the Ar gas as the exciting gas, and the DCS gas as the source gas are used to perform the nitride operation, or to a case in which the $O_2$ gas as the first reactive gas is used to perform the oxidation operation, and thus, the present invention may be suitably applicable even to a case in which other types of gas are used to perform other substrate processing operations.

In addition, for example, reactive gas supply pipes in the first plasma generation chamber 33 and the second plasma generation chamber 33B may be spaced apart from the pair of first discharge electrodes 27 and the pair of second discharge electrodes 27B, respectively. In addition, the gas exhaust pipe 16 may be installed between the first gas ejection port 35 and the second gas ejection port 35B. In a case where a plurality of gas injection ports are installed, when the distances respectively between the gas exhaust pipe 16 and at least two of the gas injection ports may be substantially identical, the substrate processing process can be more uniformly performed in the surfaces of the wafers 1, and more uniform thickness distribution or quality of a film can be achieved in the surfaces of the wafers 1.

The substrate processing apparatus according to the present invention can reduce costs for processing substrates by using plasma, so as to improve productivity in processing substrates.

<Preferred Embodiments of the Present Invention>

The present invention also includes the following embodiments.

(Supplementary Note 1)

According to a preferred embodiment of the present invention, there is provided a substrate processing apparatus comprising: a process chamber configured to process a substrate; a first plasma generation chamber installed in the process chamber; a first reactive gas supply unit configured to supply first reactive gas into the first plasma generation chamber; a pair of first discharge electrodes configured to generate plasma in the first plasma generation chamber and to excite the first reactive gas for generating an active species of the first reactive gas; a first gas ejection port installed in a side wall of the first plasma generation chamber to eject the active species of the first reactive gas toward the substrate; a second plasma generation chamber installed in the process chamber; a second reactive gas supply unit configured to supply second reactive gas into the second plasma generation chamber; a pair of second discharge electrodes configured to generate plasma in the second plasma generation chamber and to excite the second reactive gas for generating an active species of the second reactive gas; and a second gas ejection port installed in a side wall of the second plasma generation chamber to eject the active species of the second reactive gas toward the substrate.

(Supplementary Note 2)

Preferably, the substrate processing apparatus may comprise a control unit configured to control a gas supply operation performed by using the first reactive gas supply unit and the second reactive gas supply unit, and a power supply operation on the first discharge electrodes and the second discharge electrodes, wherein the control unit supplies the first reactive gas from the first reactive gas supply unit into the first plasma generation chamber to generate plasma in the first plasma generation chamber by using the first discharge electrodes, and to excite the first reactive gas for generating the active species of the first reactive gas, and processes the substrate by using the generated active species of the first reactive gas, and then, the control unit supplies the second reactive gas from the second reactive gas supply unit into the second plasma generation chamber to generate plasma in the second plasma generation chamber by using the second discharge electrodes, and to excite the second reactive gas for generating the active species of the second reactive gas, and processes the substrate by using the generated active species of the second reactive gas.

(Supplementary Note 3)

Preferably, the substrate processing apparatus may comprise an exciting gas supply unit that is configured to supply exciting gas, for indirectly exciting the first reactive gas, into the first plasma generation chamber, or to supply exciting gas, for indirectly exciting the second reactive gas, into the second plasma generation chamber.

(Supplementary Note 4)

Preferably, the substrate processing apparatus may comprise a source gas supply unit configured to supply source gas into the process chamber.

(Supplementary Note 5)

Preferably, the first discharge electrodes and the second discharge electrodes may be covered with protecting pipes.

(Supplementary Note 6)

Preferably, the substrate processing apparatus may comprise a heating unit configured to heat the substrate disposed in the process chamber.

(Supplementary Note 7)

Preferably, the substrate processing apparatus may comprise a rotation unit configured to rotate the substrate disposed in the process chamber.

(Supplementary Note 8)

According to another preferred embodiment of the present invention, there is provided a substrate processing method comprising:

a loading operation of loading a substrate into a process chamber;

a first substrate processing operation in which first reactive gas is supplied from a first reactive gas supply unit into a first plasma generation chamber to generate plasma in the first plasma generation chamber by using a pair of first discharge electrodes, and to excite the first reactive gas for generating an active species of the first reactive gas, and the substrate is processed by using the generated active species of the first reactive gas;

a second substrate processing operation in which second reactive gas is supplied from a second reactive gas supply unit into a second plasma generation chamber to generate plasma in the second plasma generation chamber by using a pair of second discharge electrodes, and to excite the second reactive gas for generating an active species of the second reactive gas, and the substrate is processed by using the generated active species of the second reactive gas; and an unloading operation in which the processed substrate is unloaded out of the process chamber.

(Supplementary Note 9)

According to another preferred embodiment of the present invention, there is provided a substrate processing apparatus comprising:

a process chamber configured to process a substrate;

a heating unit configured to heat the substrate;

a rotation unit configured to rotate the substrate;

a plurality of plasma generation chambers installed in the process chamber;

a plurality of gas supply unit configured to supply reactive gas into the plasma generation chambers, respectively;

a pair of discharge electrodes configured to generate plasma in the plasma generation chamber and to excite the reactive gas for generating an active species of the reactive gas; and gas ejection ports installed respectively in side walls of the plasma generation chambers to eject the active species of the reactive gas toward the substrate.

(Supplementary Note 10)

Preferably, the substrate processing apparatus may comprise a control unit configured to control gas supply operations performed respectively by using the gas supply units, a power supply operation on the discharge electrodes, the heating unit, and the rotation unit, wherein the control unit heats an inside of the process chamber to a predetermined temperature by using the heating unit, and simultaneously, rotates the substrate by using the rotation unit, and supplies the reactive gas respectively from the gas supply units into the plasma generation chambers to generate plasma by using the discharge electrodes, and to excite the reactive gas for generating the active species, and simultaneously processes the substrate by using the generated active species.

(Supplementary Note 11)

According to another preferred embodiment of the present invention, there is provided a substrate processing method comprising:

a loading operation in which a substrate is loaded into the process chamber;

a substrate processing operation in which an inside of the process chamber is heated to a predetermined temperature by using the heating unit, and simultaneously, the substrate is rotated by using the rotation unit, and reactive gas is supplied respectively from the gas supply units into the plasma generation chambers to generate plasma by using the discharge electrodes, and to excite the reactive gas for generating an active species, and the substrate is simultaneously processed by using the generated active species; and an unloading operation in which the processed substrate is unloaded out of the process chamber.

What is claimed is:

1. A substrate processing apparatus comprising:
   a process chamber disposed vertically in which a plurality of substrates are processed;
   a substrate holder configured to hold the plurality of substrates in a vertically stacked manner within the process chamber;
   a rotation mechanism configured to rotate the substrate holder;
   a first plasma generation chamber and a second plasma generation chamber that extends vertically provided at a side of the plurality of substrates in the process chamber, each of the first plasma generation chamber and the second plasma generation chamber are arc-shaped and being separated from the process chamber;
   a reactive gas supply unit configured to supply a reactive gas into the first plasma generation chamber and the second plasma generation chamber;
   a pair of first discharge electrodes configured to generate plasma and excite the reactive gas by the plasma in the first plasma generation chamber to generate an active species of the reactive gas, wherein the first discharge electrodes are inserted in protecting pipes and are vertically disposed within the first plasma generation chamber;
   a pair of second discharge electrodes configured to generate plasma and excite the reactive gas by the plasma in the second plasma generation chamber to generate the active species of the reactive gas, wherein the second discharge electrodes are inserted in protecting pipes and are vertically disposed within the second plasma generation chamber;
   a plurality of first gas ejection ports and a plurality of second gas ejection ports provided at the first plasma generation chamber and the second plasma generation chamber, respectively, each of the plurality of first gas ejection ports and the plurality of second gas ejection ports being configured to eject the active species of the reactive gas to the plurality of substrates in the process chamber;
   a buffer chamber provided at the side of the plurality of substrates in the process chamber, the buffer chamber being separated from the process chamber;
   a source gas supply unit configured to supply a source gas into the buffer chamber;
   a plurality of third gas ejection ports provided at the buffer chamber to eject the source gas to the plurality of substrates in the process chamber; and
   a controller configured to control the rotation mechanism, the reactive gas supply unit, the pair of first discharge electrodes, the pair of second discharge electrodes and the source gas supply unit so as to perform a cycle a predetermined number of times in a state where the substrate holder holding the plurality of substrates is rotated, the cycle including supplying the source gas to the plurality of substrates in the process chamber, and supplying of the active species including supplying the reactive gas into the first plasma generation chamber and the second plasma generation chamber, exciting the reactive gas by the plasma to generate the active species of the reactive gas in the first plasma generation chamber and the second plasma generation chamber, and simultaneously ejecting the active species from the first plasma generation chamber and the second plasma generation chamber to the plurality of the substrates in the process chamber,
   wherein the plurality of first gas ejection ports are installed at least as many as a number of the plurality of substrates, the plurality of second gas ejection ports are installed at least as many as the number of the plurality of substrates and the plurality of third ejection ports are installed at least as many as the number of the plurality of substrates, and
   wherein the plurality of first gas ejection ports are disposed at heights to face a space between two neighboring substrates of the plurality of substrates held in the substrate holder, the plurality of second gas ejection ports are disposed at heights to face the space between two neighboring substrates of the plurality of substrates held in the substrate holder, and the plurality of third gas ejection ports are disposed at heights to face the space between two neighboring substrates of the plurality of substrates held in the substrate holder.

2. The substrate processing apparatus of claim 1, wherein the first plasma generation chamber and the second plasma generation chamber are disposed along a circumferential direction of the plurality of the substrates.

3. The substrate processing apparatus of claim 1, wherein the plurality of first gas ejection ports and the plurality of second gas ejection ports are installed in a stacked direction of the plurality of substrates.

4. The substrate processing apparatus of claim 3, wherein each of the plurality of first gas ejection ports corresponds to each of the plurality of the second gas ejection ports at a same height.

5. The substrate processing apparatus of claim 4, wherein the plurality of third gas ejection ports are installed in the stacked direction of the plurality of substrates, each of the plurality of third gas ejection ports corresponding to each of the plurality of first gas ejection ports and each of the plurality of second gas ejection ports at a same height.

6. The substrate processing apparatus of claim 3, wherein each of the plurality of first gas ejection ports corresponds to each of the plurality of the substrates at a same height, and each of the plurality of second gas ejection ports corresponds to each of the plurality of substrates at a same height.

7. The substrate processing apparatus of claim 6, wherein the plurality of third gas ejection ports are installed in the stacked direction of the plurality of substrates, each of the plurality of third gas ejection ports corresponds to each of the plurality of substrates at a same height.

8. The substrate processing apparatus of claim 3, wherein the plurality of third gas ejection ports are installed in the stacked direction of the plurality of substrates.

9. The substrate processing apparatus of claim 3, further comprising:
a first partition wall configured to separate the first plasma generation chamber and the process chamber; and
a second partition wall configured to separate the second plasma generation chamber and the process chamber,
wherein the plurality of first gas ejection ports are provided at the first partition wall and the plurality of second gas ejection ports are provided at the second partition wall.

10. The substrate processing apparatus of claim 1, further comprising:
a first partition wall configured to separate the first plasma generation chamber and the process chamber; and
a second partition wall configured to separate the second plasma generation chamber and the process chamber,
wherein the plurality of first gas ejection ports are provided at the first partition wall and the plurality of second gas ejection ports are provided at the second partition wall.

11. The substrate processing apparatus of claim 1, wherein the first plasma generation chamber and the second plasma generation chamber are disposed along a circumferential direction of the plurality of substrates.

12. The substrate processing apparatus of claim 1, further comprising:
an exhaust system configured to exhaust an inside of the process chamber through an exhaust pipe connected with a side wall disposed on a side of the process chamber.

13. The substrate processing apparatus of claim 1, further comprising:
a heater configured to heat the plurality of substrates and surround the process chamber, the first plasma generation chamber, and the second plasma generation chamber.

14. A substrate processing apparatus comprising:
a process chamber disposed vertically in which a plurality of substrates are processed;
a substrate holder configured to hold the plurality of substrates in a vertically stacked manner within the process chamber;
a rotation mechanism configured to rotate the substrate holder;
a first plasma generation chamber and a second plasma generation chamber that extends vertically provided at a side of the plurality of substrates in the process chamber, each of the first plasma generation chamber and the second plasma generation chamber are arc-shaped and being separated from the process chamber;
a reactive gas supply unit configured to supply a reactive gas into the first plasma generation chamber and the second plasma generation chamber;
a pair of first discharge electrodes configured to generate plasma and excite the reactive gas by the plasma in the first plasma generation chamber to generate an active species of the reactive gas, wherein the first discharge electrodes are inserted in protecting pipes and are vertically disposed within the first plasma generation chamber;
a pair of second discharge electrodes configured to generate plasma and excite the reactive gas by the plasma in the second plasma generation chamber to generate the active species of the reactive gas, wherein the second discharge electrodes are inserted in protecting pipes and are vertically disposed within the second plasma generation chamber;
a plurality of first gas ejection ports and a plurality of second gas ejection ports provided at the first plasma generation chamber and the second plasma generation chamber, respectively, each of the plurality of first gas ejection ports and the plurality of second gas ejection ports being configured to eject the active species of the reactive gas to the plurality of substrates in the process chamber;
a buffer chamber provided at the side of the plurality of substrates in the process chamber, the buffer chamber separated from the process chamber;
a source gas supply unit configured to supply a source gas into the buffer chamber;
a plurality of third gas ejection ports provided at the buffer chamber to eject the source gas to the plurality of substrates in the process chamber;
an exhaust system configured to exhaust an inside of the process chamber through an exhaust pipe connected with a side wall disposed on a side of the process chamber; and
a controller configured to control the rotation mechanism, the reactive gas supply unit, the pair of first discharge electrodes, the pair of second discharge electrodes, the source gas supply unit and the exhaust system so as to perform a cycle a predetermined number of times in a state where the substrate holder holding the plurality of substrates is rotated, the cycle including supplying the source gas to the plurality of substrates in the process chamber and exhausting the source gas from the process chamber, and supplying the active species to the plurality of substrates in the process chamber and exhausting the active species from the process chamber, the supplying of the active species including supplying the reactive gas into the first plasma generation chamber and the second plasma generation chamber, exciting the reactive gas by the plasma to generate the active species of the reactive gas in the first plasma generation chamber and the second plasma generation chamber, and simultaneously ejecting the active species from the first plasma generation chamber and the second plasma generation chamber to the plurality of substrates in the process chamber,
wherein the plurality of first gas ejection ports are installed at least as many as a number of the plurality of substrates, the plurality of second gas ejection ports are installed at least as many as the number of the plurality of substrates and the plurality of third ejection ports are installed at least as many as the number of the plurality of substrates, and
wherein the plurality of first gas ejection ports are disposed at heights to face a space between two neighboring substrates of the plurality of substrates held in the substrate holder, the plurality of second gas ejection ports are disposed at heights to face the space between two neighboring substrates of the plurality of substrates held in the substrate holder, and the plurality of third gas ejection ports are disposed at heights to face the space between two neighboring substrates of the plurality of substrates held in the substrate holder.

15. The substrate processing apparatus of claim 14, further comprising:
a first partition wall configured to separate the first plasma generation chamber and the process chamber; and
a second partition wall configured to separate the second plasma generation chamber and the process chamber,
wherein the plurality of first gas ejection ports are provided at the first partition wall and the plurality of second gas ejection ports are provided at the second partition wall.

16. The substrate processing apparatus of claim 14, wherein the first plasma generation chamber and the second plasma generation chamber are disposed along a circumferential direction of the plurality of substrates.

17. The substrate processing apparatus of claim 14, further comprising:
a heater configured to heat the plurality of substrates and surround the process chamber, the first plasma generation chamber, and the second plasma generation chamber.

* * * * *